United States Patent [19]

Penunuri et al.

[11] Patent Number: 5,635,883

[45] Date of Patent: Jun. 3, 1997

[54] ACOUSTIC WAVE FILTER WITH FILTER-SHAPING ELEMENT AND METHOD

[75] Inventors: David Penunuri, Fountain Hills;
Thomas S. Hickernell, Mesa;
Frederick Yi-Tung Cho, Gilbert, all of Ariz.

[73] Assignee: Motorola, Inc., Schaumburg, Ill.

[21] Appl. No.: 520,063

[22] Filed: Aug. 28, 1995

[51] Int. Cl.$^6$ .................. H03H 9/00; H03H 9/64
[52] U.S. Cl. .................. 333/195; 333/194; 333/193; 310/313 R; 310/313 D
[58] Field of Search .................. 333/193–196; 310/313 R, 313 B, 313 C, 313 D

[56] References Cited

U.S. PATENT DOCUMENTS

| | | | |
|---|---|---|---|
| 4,166,258 | 8/1979 | Tseng et al. | 333/195 |
| 4,454,488 | 6/1984 | Hartmann | 333/195 |
| 4,734,664 | 3/1988 | Hikita et al. | 333/193 |
| 4,803,449 | 2/1989 | Hikita et al. | 333/193 |
| 4,931,755 | 6/1990 | Sakamoto et al. | 333/193 |
| 5,202,652 | 4/1993 | Tabuchi et al. | 333/193 |
| 5,296,824 | 3/1994 | Cho et al. | 333/193 |
| 5,334,960 | 8/1994 | Penunuri | 333/193 |
| 5,471,178 | 11/1995 | Hickernell | 333/193 |
| 5,521,453 | 5/1996 | Yatsuda | 333/193 |

FOREIGN PATENT DOCUMENTS

| | | |
|---|---|---|
| 2310969 | 1/1992 | European Pat. Off. |
| 454011 | 2/1992 | Japan . |
| 4113712 | 4/1992 | Japan . |
| 583084 | 4/1993 | Japan . |
| 5183373 | 7/1993 | Japan . |
| 6152317 | 5/1994 | Japan . |
| 6260876 | 9/1994 | Japan . |
| 0633659 | 1/1995 | Japan . |
| 0633660 | 1/1995 | Japan . |

OTHER PUBLICATIONS

A Japanese Published Abstract, App. No. JP930048055 (Mar. 9, 1993), Pub. No. JP6260876, Pub. Sep. 16, 1994, Nagatsuka Tsutomi et al.

A Japanese Published Abstract, App. No. JP93005575 (Feb. 19, 1993), Pub. No. JP6244676, Pub. Sep. 2, 1994., Iori Kazabyru et al.

"Development of Low–Loss Band–Pass Filters Using SAW Resonators For Portable Telephones", presented at the 1992 IEEE Ultrasonics Symposium, Tuscon, AZ by O. Ikata, T. Miyashita, T. Matsuda, T. Nishihara and Y. Satoh.

*Primary Examiner*—Benny Lee
*Assistant Examiner*—Darius Gambino
*Attorney, Agent, or Firm*—Frederick M. Fliegel

[57] ABSTRACT

An acoustic wave filter (200, 300) having a substrate for supporting propagation of acoustic waves, and first (220, 315), second (235, 330) and third (210, 310) acoustic wave transducers disposed on the substrate. The first acoustic wave transducer (220, 315) includes at least one bus bar (221, 316) electrically coupled to a first electrical port (205, 305) of the acoustic wave filter (200, 300). The second acoustic wave transducer (235, 330) is disposed on the substrate in line with the first acoustic wave transducer (220, 315) and is acoustically coupled thereto. The second acoustic wave transducer (235, 330) includes at least one bus bar (236', 331) electrically coupled to a second electrical port (240, 345) of the acoustic wave filter (200, 300). The third acoustic wave transducer (210, 310) includes at least one bus bar (211, 311') electrically coupled to the first electrical port (205, 305). The third acoustic wave transducer (210, 310) is acoustically decoupled from either the first (220, 315) or second (235, 330) acoustic wave transducers.

19 Claims, 2 Drawing Sheets

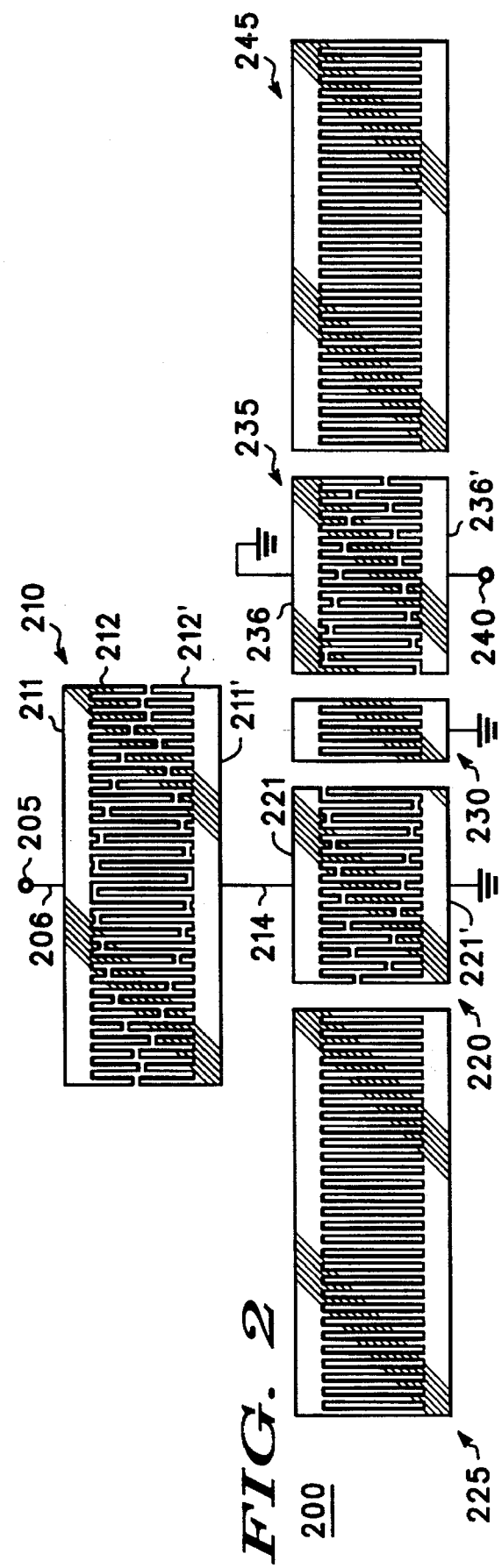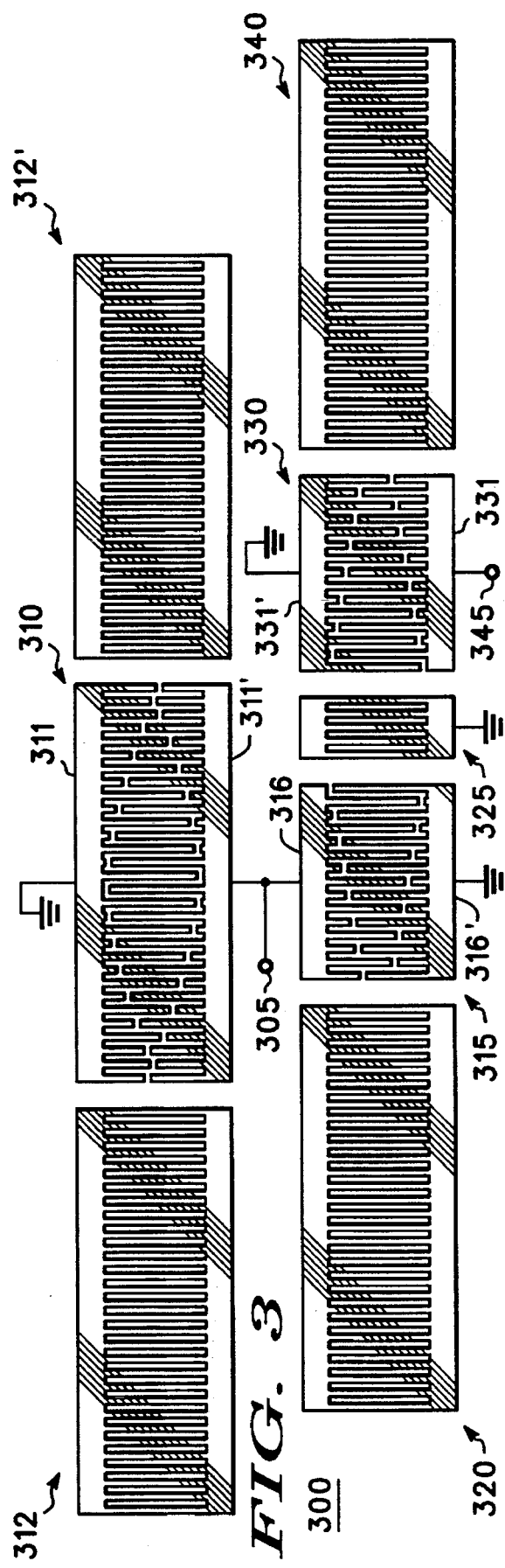

С,635,883

1

ACOUSTIC WAVE FILTER WITH FILTER-SHAPING ELEMENT AND METHOD

FIELD OF THE INVENTION

The present invention is generally related to the field of frequency selection components, more specifically to the field of monolithic frequency selection components and still more specifically to the field of monolithic acoustic frequency selection components and associated methods.

BACKGROUND OF THE INVENTION

There exists an ongoing need for acoustic wave filters and delay lines for a variety of practical applications. Acoustic wave devices are becoming particularly important in the production of electronic signal processing equipment, especially radios, because they can be readily mass produced and are of small size and also because of increased pressure to employ available radio spectrum efficiently. Acoustic wave devices are generally constructed on planar surfaces using techniques similar to those employed in manufacturing integrated circuits.

Acoustic wave filters employ generally periodic arrays of electrodes configured to provide discrete elements such as transducers (for converting electrical to mechanical energy and vice versa), reflectors (for reversing the direction of propagation of an acoustic wave) and gratings (e.g., for separating transducers and/or resonant cavities and/or providing electrical isolation therebetween). These elements are grouped in a generally in-line configuration (e.g., reflector, transducer, grating, transducer, reflector) and are separated by inter-element gaps, with the entire array providing an electrical filtering function associated with the electrical port(s) of the transducer(s).

The desired electrical performance often dictates that the composite filter employ more than two acoustically coupled transducers, external matching and band-shaping components or involves other (e.g. size-related) requirements not consistent with the needs of a specific application. Failure to include these elements often leads to bandwidth perturbations from the desired, and/or increased in-band (i.e., passband) insertion loss and decreased out-of-band (i.e., stop-band) rejection.

What are needed are an apparatus and a method for making acoustic wave filters having electrical performance characteristics that achieve a combination of frequency selection characteristics, insertion loss and footprint (i.e., package areal mounting requirements) not previously available for filters comprising a single pair of acoustically coupled transducers.

BRIEF DESCRIPTION OF THE DRAWINGS

FIG. 2 is a sketch of a plan view of an acoustic wave filter in accordance with one embodiment of the present invention; and FIG. 3 is a sketch of a plan view of an acoustic wave filter in accordance with another embodiment of the present invention.

DETAILED DESCRIPTION OF THE DRAWINGS

Figure 1:
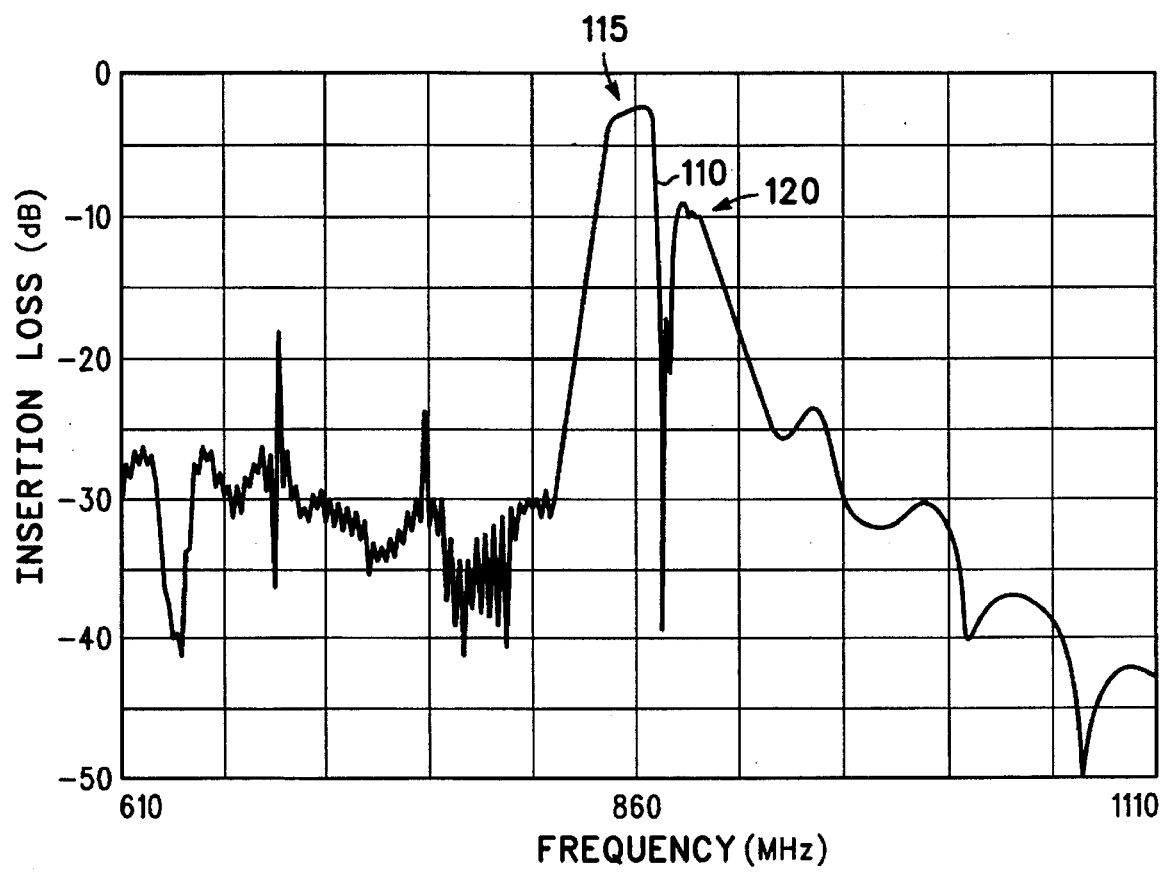
FIG. 1 is a graph of an acoustic wave filter transfer function in accordance with the prior art.

FIG. 1 illustrates trace 110 comprising a frequency response or transfer function for a filter having a first transducer for converting an electrical input signal to an acoustic wave and a second transducer acoustically coupled to the first transducer. The second transducer converts the acoustic wave to a second electrical signal or output signal. The frequency dependencies of the transfer functions of the first and second transducers combine to provide a filtering function as illustrated by trace 110 of FIG. 1. Trace 110 includes passband region 115, corresponding to signals having a frequency that is intended to be coupled from the input to the output with relatively little attenuation. Passband region 115 is desirably surrounded by frequencies for which signals are greatly attenuated in passing from input to output. Region 120 corresponds to signals at a frequency that usefully would be attenuated more than is feasible for at least some choices of passband region 115 insertion loss (ca. 2.5 dB as illustrated in FIG. 1), substrate material, filter size constraints and other criteria associated with filter design. Greater attenuation of signals corresponding to region 120 (or other, selected regions other than region 115), and/or shaping of the characteristics of region 115, may be provided by either of the configurations illustrated in FIGS. 2, 3 or combinations of the configurations depicted therein.

Filters such as filters 200, 300 illustrated in FIGS. 2, 3, respectively, may be constructed on suitably-prepared substrata such as lithium niobate, lithium tetraborate, lithium tantalate, aluminum phosphate or quartz and may employ surface or Rayleigh waves, surface skimming bulk acoustic waves, leaky waves, bulk acoustic waves or other forms of acoustic propagation as dictated by requirements for filter performance.

EMBODIMENT I

FIG. 2 is a sketch of a plan view of acoustic wave filter 200 in accordance with one embodiment of the present invention. Filter 200 includes electrical input 205 electrically coupled to bus bar 211 of transducer 210 via interconnection 206. It will be appreciated that designation of an electrical connection as "input" or "output" is arbitrary and that these labels are employed for clarity of presentation and ease of understanding. Bus bar 211' is electrically coupled to bus bar 221 of transducer 220 via interconnection 214. Bus bars 211, 211' are in turn electrically coupled to interdigitated or interleaved electrodes 212, 212' and acoustic waves are generated when the electrical excitation present at bus bars 211, 211' is of an appropriate frequency. Transducer 210 (and transducer 310, FIG. 3, infra) may be modeled as a series resonant R-L-C (resistor-inductor-capacitor coupled in series) circuit in shunt with a capacitor and as having resonant and antiresonant frequencies at which the electrical impedance (i.e., measured between bus bars 211, 211') of transducer 210 is very low and very high, respectively.

Transducer 220 comprises bus bars 221, 221' each coupled to interdigitated electrodes analogous to electrodes 212, 212' of transducer 210, with bus bar 221' illustrated as being coupled to ground. Transducer 220 is acoustically coupled to transducer 235 and is usefully physically separated therefrom and electrically isolated therefrom by optional grating structure 230. Transducer 235 in turn comprises bus bars 236, 236' coupled to interdigitated electrodes as illustrated and analogous to electrodes 212, 212' of transducer 210. Transducer 235 has bus bar 236 coupled to ground and has bus bar 236' coupled to output 240. It will be appreciated that other interconnection schemata (e.g., a balanced interconnection) are also possible. Transducers 220, 235 are desirably contained within an acoustic cavity formed by optional reflector structures 225, 245 (and optionally, transducer 210 may also be contained in another, separate cavity between other reflectors as shown for transducer 310, FIG. 3, not illustrated in FIG. 2). Reflector structures 225, 245 may be realized as a series of electrodes each coupled to both of the associated bus bar structures (as illustrated), as a series of floating electrode structures (i.e., not electrically interconnected), as grooves or ridges on the surface of the substrate and may comprise metallic structures, dielectric structures or other materials as is well known in the relevant arts. Reflector structures 225, 245, transducers 220, 235 and/or optional grating structure 230 (as well as analogous structures associated with FIG. 3, infra) are conveniently fabricated from a single layer of metal deposited on the substrate surface and defined via a photolithographic process analogous to those employed in the manufacture of integrated circuits. Electrodes comprising transducers 220, 235 and optional reflector structures 225, 245 are conveniently chosen to be one-fourth of an acoustic wavelength in width measured in the direction of acoustic wave propagation, however, other widths are also possible and useful in the relevant arts.

EXAMPLE I

A 13 dB improvement is provided in out-of-band signal suppression (at a frequency of about 710 MHz) for a filter constructed on 41° rotated, Y-cut lithium niobate and employing leaky surface waves, having a geometry in accordance with that illustrated in FIG. 3. The increase in passband insertion loss is only 2 dB, i.e., the overall filter selectivity has improved substantially without great compromise in passband insertion loss. In this example, the acoustically-coupled transducers are chosen to have nominal center frequencies of about 860 MHz while the filter-shaping transducer (analogous to transducer 310, FIG. 3, infra) is chosen to have a nominal center frequency of about 764 MHz.

EXAMPLE II

A filter is desired to have a 74.4 MHz passband and is realized as a first transducer 64 wavelengths long and a second transducer acoustically coupled to the first transducer where the second transducer is chosen to be 92 wavelengths long, with both transducers having beamwidths 15 wavelengths wide (measured from near one bus bar to near the other bus bar), fabricated on an ST-cut, X propagating quartz substrate and employing split (i.e., pairs of one-eighth wavelength wide arranged in a largely ... ─┼┼─── ─┼┼─ ...    {Ex. i} order, with + corresponding to connection to one bus bar and − corresponding to connection to the other bus bar, when viewed along a line midway between bus bars) electrodes. The transducer lengths influence stopband frequencies while the beamwidth provides an appropriate electrical impedance. The transducers are separated by a grating structure 1.5 wavelengths long, measured in a direction of acoustic wave propagation, and the transducers are contained in a cavity formed by a pair of reflective gratings 66 wavelengths long. This length is limited by constraints on package length measured in the direction of acoustic wave propagation and does not necessarily provide stopband attenuation as required for this application, which might be met by increasing filter length.

Including a filter-shaping transducer analogous to transducer 310 (FIG. 3) provides an alternative way to suppress the out-of-band filter response to at least −15 dB relative to the passband insertion loss at a frequency of ±KHz from the 74.4 MHz center frequency, when (in this example) the filter-shaping transducer is chosen to have a nominal center frequency of 74.4 and a length of 288 wavelengths, however, it will be appreciated that transducer length and frequency/wavelength will vary from one example to another. The filter-shaping transducer for this example is chosen to comprise one-eighth wavelength wide electrodes and is unweighted except that it includes a phase reversal near the center of the transducer (i.e., the ... ─┼┼─── ─┼┼─ ...    {Ex. ii} sequence is interrupted to provide a

... ─┼┼─── ─┼┼┼┼─── ─┼┼─ ...    {Ex. III} sequence or phase reversal). Including this filter-shaping element achieves the required 15 dB suppression at ±200 KHz from 74.4 MHz. Impedance matching is effectuated by inclusion of a shunt inductor having an appropriate inductance.

EMBODIMENT II

FIG. 3 is a sketch of a plan view of acoustic wave filter 300 in accordance with another embodiment of the present invention. Filter 300 comprises input 305 electrically coupled to bus bar 316 of transducer 315 and to bus bar 311' of transducer 310. Bus bar 311 of transducer 310 is illustrated as being coupled to ground, however, it will be appreciated that other electrical coupling arrangements (e.g., balanced structures) are possible. Transducer 310 is illustrated as being contained within a cavity formed by optional reflector structures 312, 312'. Transducer 315 also includes bus bar 316' and comprises interdigitated electrodes analogous to electrodes 212, 212' of FIG. 2. Transducer 315 generates acoustic waves when stimulated by electrical signals having an appropriate frequency applied to bus bars 316, 316' and thence to the interdigitated electrodes. The acoustic waves in turn insonify (i.e., expose to and immerse in sound) transducer 330, giving rise to electrical signals manifested at bus bars 331, 331'. Transducers 315, 330 are desirably separated by optional grating structure 325, which may have a periodicity different than that of the interdigitated electrodes comprising transducers 315, 330. Transducers 315, 330 are desirably contained within a cavity comprising optional reflector structures 320, 340, analogous to reflector structures 225, 245 of filter 200 (FIG. 2, supra).

Significant features of filters 200, 300 of FIGS. 2, 3 include (i) a pair of acoustically coupled transducers 220, 235 and/or 315, 330, each coupled to an electrical port; (ii) at least another transducer 210, 310 electrically coupled or connected to one of transducers 220, 315 but acoustically decoupled from any of transducers 220, 235, 315, 330; (iii) wherein the another transducer is coupled in series (210) or shunt (310) with an electrical connection to filter 200/300; (iv) and wherein the at least another transducer may have a center frequency (and therefore periodicity) different than that of transducers 220, 235, 315, 330. It will be appreciated that various combinations of the approaches described in FIGS. 2, 3 and associated text may be combined. For example, a filter might include a series transducer (e.g., 210) at the input and a shunt transducer (e.g., 310) at the output, or include a series (e.g., 210) and a shunt (e.g., 310) transducer at one or more electrical ports such as input, output etc., or include series and/or shunt transducers at either or both electrical ports. It will also be appreciated that one acoustic wave transducer may be employed as a series or shunt impedance element in association with at least another transducer, preferably having a different periodicity than the one transducer and where the at least another transducer is desirably contained in a cavity comprising acoustic reflector, where the another transducer provides a principal component of the frequency selection function.

Optional reflector structures 225, 245 and/or 320, 340 act to reduce insertion loss of filter 200 and/or 300, but also increase the overall length of filter 200/300. Some applications may restrict the total length of filter 200/300 and this in turn may impact electrical performance of filter 200/300. Inclusion of transducer 210 and/or 310 increases filter breadth but not length and may permit a tradeoff between filter breadth and length consistent with electrical performance requirements as well as footprint constraints placed on filter length and/or breadth.

Thus, an acoustic wave filter has been described which overcomes specific problems and accomplishes certain advantages relative to prior art methods and mechanisms. The improvements over known technology are significant. The size constraints and out-of-band frequency response artifacts of some prior art approaches are alleviated. It will be appreciated by those of skill in the art that other approaches to realizing transducers besides apodization (as illustrated in FIGS. 2, 3) may be employed, such as, by way of example, uniform weighting, phase reversal transducers, phase weighted transducers, withdrawal weighted transducers, chirp or other aperiodic weighting and other techniques and these variations are intended to be included in the scope of the invention as claimed.

The foregoing description of the specific embodiments will so fully reveal the general nature of the invention that others can, by applying current knowledge, readily modify and/or adapt for various applications such specific embodiments without departing from the generic concept, and therefore such adaptations and modifications should and are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

We claim:

1. An acoustic wave filter comprising:

a substrate for supporting propagation of acoustic waves;

a first acoustic wave transducer disposed on said substrate, said first acoustic wave transducer including at least one bus bar electrically coupled to a first electrical port of said acoustic wave filter;

a second acoustic wave transducer disposed on said substrate in line with said first acoustic wave transducer and acoustically coupled thereto, said second acoustic wave transducer including at least one bus bar electrically coupled to a second electrical port of said acoustic wave filter; and a third acoustic wave transducer disposed on said substrate, said third acoustic wave transducer including a first bus bar electrically coupled to said first electrical port, said third acoustic wave transducer acoustically decoupled from either said first or second acoustic wave transducers, wherein a periodicity of electrodes comprising said third acoustic wave transducer differs from a periodicity of electrodes comprising said first and second acoustic wave transducers.

2. A filter as claimed in claim 1, wherein said third acoustic wave transducer is coupled in series between said first acoustic wave transducer and said first electrical port such that a second bus bar of said third acoustic wave transducer is coupled to said at least one bus bar of said first acoustic wave transducer.

3. A filter as claimed in claim 1, wherein said third acoustic wave transducer is coupled in shunt with said first acoustic wave transducer and said first electrical port.

4. A filter as claimed in claim 1, wherein said substrate comprises a material chosen from a group consisting of lithium niobate, lithium tetraborate, lithium tantalate, aluminum phosphate and quartz.

5. A filter as claimed in claim 1, further comprising a grating disposed between said first and second acoustic wave transducers.

6. A method for making acoustic wave filter, said method comprising:

providing a substrate for supporting propagation of acoustic waves;

disposing a first acoustic wave transducer on said substrate, said step of disposing said first acoustic wave transducer including steps of disposing at least one bus bar and electrically coupling said at least one bus bar to a first electrical port of said acoustic wave filter;

disposing a second acoustic wave transducer on said substrate in line with said first acoustic wave transducer and acoustically coupled thereto, said step of disposing said second acoustic wave transducer including steps of disposing at least one bus bar and electrically coupling said at least one bus bar to a second electrical port of said acoustic wave filter; and disposing a third acoustic wave transducer on said substrate, said step of disposing said third acoustic wave transducer including steps of disposing at least one bus bar and electrically coupling said at least one bus bar to said first electrical port, wherein said third acoustic wave transducer is acoustically decoupled from said first acoustic wave transducer and said second acoustic wave transducer, wherein said steps of disposing first and second acoustic wave transducers include steps of disposing electrodes having a periodicity different from electrodes comprising said third acoustic wave transducer.

7. A method as claimed in claim 6, wherein said step of electrically coupling said at least one bus bar of said third acoustic wave transducer includes a step of electrically coupling said third acoustic wave transducer in series between said first acoustic wave transducer and said first electrical port such that a first bus bar of said third acoustic wave transducer is coupled to said first electrical port and a second bus bar of said third acoustic wave transducer is coupled to said at least one bus bar of said first acoustic wave transducer.

8. A method as claimed in claim 6, wherein said step of electrically coupling said at least one bus bar of said third acoustic wave transducer includes a step of electrically coupling said third acoustic wave transducer in shunt with said first acoustic wave transducer and said first electrical port.

9. A method as claimed in claim 6, wherein said step of providing a substrate comprises a step of providing a substrate comprising a material chosen from a group consisting of lithium niobate, lithium tetraborate, lithium tantalate, aluminum phosphate and quartz.

10. A method as claimed in claim 6, further comprising a step of disposing a grating between said first and second acoustic wave transducers, wherein said grating comprises electrodes aperiodic with electrodes comprising said first and second acoustic wave transducers.

11. An acoustic wave filter comprising:

a substrate for supporting propagation of acoustic waves;

a first acoustic wave transducer disposed on said substrate, said first acoustic wave transducer including at least one bus bar electrically coupled to a first electrical port of said acoustic wave filter; and another acoustic wave transducer disposed on said substrate, said another acoustic wave transducer including at least one bus bar electrically coupled to said first electrical port, said another acoustic wave transducer acoustically decoupled from said first acoustic wave transducer, wherein a first periodicity of interleaved electrodes comprising said first acoustic wave transducer and a second periodicity of interleaved electrodes comprising said second acoustic wave transducer each differ from another periodicity of electrodes comprising said another acoustic wave transducer.

12. A filter as claimed in claim 11, further comprising a second acoustic wave transducer disposed on said substrate in line with said first acoustic wave transducer and acoustically coupled thereto, said second acoustic wave transducer including at least one bus bar electrically coupled to a second electrical port of said acoustic wave filter, wherein said first, second and another acoustic wave transducers each comprise interleaved electrodes.

13. A filter as claimed in claim 12, wherein said another acoustic wave transducer is coupled in series between said first acoustic wave transducer and said first electrical port such that a first bus bar of said another acoustic wave transducer is coupled to said first electrical port and a second bus bar of said another acoustic wave transducer is coupled to said at least one bus bar of said first acoustic wave transducer.

14. A filter as claimed in claim 12, wherein said another acoustic wave transducer is coupled in shunt with said first acoustic wave transducer and said first electrical port such that a first bus bar of said another acoustic wave transducer is coupled to said first electrical port and a second bus bar of said another acoustic wave transducer is coupled to ground.

15. A filter as claimed in claim 12, wherein said substrate comprises a material chosen from a group consisting of lithium niobate, lithium tetraborate, lithium tantalate, aluminum phosphate and quartz, and wherein said filter further comprises a grating disposed between said first and second acoustic wave transducers.

16. An acoustic wave filter as claimed in claim 1, further including:

a first reflector disposed to a first side of said third acoustic wave transducer; and a second reflector disposed to a second side of said third transducer, said first and second reflectors and said third transducer disposed in an in-line configuration to form an acoustic resonator.

17. An acoustic wave filter as claimed in claim 16, wherein said third acoustic wave transducer includes an apodized transducer.

18. A method as claimed in claim 6, further including steps of:

disposing a first acoustic wave reflector on said substrate to a first side of said third acoustic wave transducer; and disposing a second acoustic wave reflector on said substrate to a second side of said third acoustic wave transducer, whereby said first and second reflectors and said third transducer are disposed in an in-line configuration to form an acoustic resonator.

19. A filter as claimed in claim 11, further comprising:

a first reflector disposed to a first side of said another acoustic wave transducer; and a second reflector disposed to a second side of said another transducer, said first and second reflectors and said another transducer disposed in an in-line configuration to form an acoustic resonator.

* * * * *